United States Patent [19]

Andoh et al.

[11] Patent Number: 5,466,613
[45] Date of Patent: Nov. 14, 1995

[54] METHOD OF MANUFACTURING A CAMERA DEVICE

[75] Inventors: Fumihiko Andoh; Kazunori Miyakawa, both of Tokyo; Hidekazu Yamamoto; Masao Yamawaki, both of Hyogo, all of Japan

[73] Assignees: Nippon Hoso Kyokai; Mitsubishi Denki Kabushiki Kaisha, both of Tokyo, Japan

[21] Appl. No.: 370,958

[22] Filed: Jan. 10, 1995

Related U.S. Application Data

[62] Division of Ser. No. 77,070, Jun. 16, 1993, Pat. No. 5,399,882.

[30] Foreign Application Priority Data

Jun. 19, 1992 [JP] Japan .................................... 4-161053

[51] Int. Cl.⁶ ........................ H01L 31/18; H01L 31/0272
[52] U.S. Cl. .............................. 437/3; 437/232; 437/916; 148/DIG. 172; 313/386
[58] Field of Search .................. 148/DIG. 172; 437/3, 232, 916; 427/68

[56] References Cited

U.S. PATENT DOCUMENTS

| 3,966,512 | 6/1976 | Nonaka ................................. 437/232 |
| 4,445,131 | 4/1984 | Nonaka et al. . |
| 4,900,975 | 2/1990 | Shimomoto et al. .................... 313/366 |
| 5,196,702 | 3/1993 | Tsuji et al. ............................. 250/327.2 |
| 5,233,265 | 8/1993 | Takasaki et al. ....................... 313/366 |

FOREIGN PATENT DOCUMENTS

| 0276683 | 8/1988 | European Pat. Off. . |
| 61-183839 | 8/1986 | Japan . |
| 61-193335 | 8/1986 | Japan . |
| 61-225740 | 10/1986 | Japan . |
| 62-262348 | 11/1987 | Japan . |
| 63-174244 | 7/1988 | Japan . |
| 1-192178 | 8/1989 | Japan . |

OTHER PUBLICATIONS

R. G. Neuhauser, J. Electrochem. Soc., 134, 1 (1987) pp. 6C–13C, "Photoconductors Utilized in TV Camera Tubes".
IEEE Electron Device Letters, vol. EDL–8, No. 9, Sep. 1987, p. 392.
Electro Chemistry and Industrial Physical Chemistry, vol. 56, 1988, p. 516.
Proceedings of National Conference of the Institute of Television Engineers of Japan, 1989, p. 41.
IEEE International Solid–State Circuit Conference, 1990, pp. 212 and 213.
Mat. Res. Soc. Synp. Proc., vol. 77, 1987, pp. 217–222.
Japanese Journal of Applied Physics, vol. 28, No. 2, Feb. 1989, pp. 178–186.
Proceedings of National Conference of the Institute of Television Engineers of Japan 2–8, 1987, pp. 31–32.
ITEJ Technical Report, vol. 12, No. 50, pp. 37–42 (1988).

*Primary Examiner*—Brian E. Hearn
*Assistant Examiner*—Leon Radomsky
*Attorney, Agent, or Firm*—Lowe, Price, LeBlanc & Becker

[57] ABSTRACT

A camera device having favorable multiplication characteristics (quantum efficiency) as well as improved sensitivity in a visible light region (especially the region on the red side) and a method of manufacturing the same are provided. The camera device includes a hole injection stop layer, a first photoelectric converting layer including selenium, a second photoelectric converting layer having spectral sensitivity characteristics which are different from those of the first photoelectric converting layer, a third photoelectric converting layer including selenium, and an electron injection stop layer. As a result, it is possible to improve multiplication characteristics (quantum efficiency) and to improve the sensitivity in the visible light region (especially the region on the red side) simultaneously.

2 Claims, 6 Drawing Sheets

LIGHT A →

ELECTRON BEAM
B SCANNING

METHOD OF MANUFACTURING A CAMERA DEVICE

This application is a division of application Ser. No. 08/077,070 filed Jun. 16, 1993 now U.S. Pat. No. 5,399,882.

BACKGROUND OF THE INVENTION

1. Field of the Invention

The present invention generally relates to camera devices and a method of manufacturing the same, and more particularly, to a camera device having a photoelectric converting portion and a method of manufacturing the same.

2. Description of the Background Art

With a camera device made high in quality and in density, high sensitivity in a photoelectric converting portion of the camera device has been conventionally required. As for the camera device, a camera tube, a solid state image sensing device and the like are known.

FIG. 6 is a schematic cross sectional view showing a structure of a conventional camera tube. This is disclosed in, for example, Japanese Journal of Applied Physics, Vol. 28, No. 2, February 1989, pp. 178–186, or the like. FIG. 7 is an enlarged cross sectional view showing a structure of a target portion of the camera tube shown in FIG. 6. The target portion shown in FIG. 7 is disclosed in, for example, IEEE Electron Device Letters, Vol. EDL-8, No. 9, September 1987, p. 392 or the like.

Referring to FIGS. 6 and 7, the conventional camera tube includes a glass tube 101, a target portion 106 attached so as to hermetically seal an opening end of glass tube 101, a cathode 102 attached in glass tube 101 so as to oppose target portion 106 for generating an electron beam, an accelerating electrode 103 attached in glass tube 101 for accelerating the electron beam, a polarization coil 104 disposed along a circumference of glass tube 101 for polarizing the electron beam, and a focus coil 105 disposed so as to surround polarization coil 104 for focusing the electron beam.

As shown in FIG. 7, target portion 106 includes a glass substrate 1, a transparent conductive film 2 formed on the surface of glass substrate 1 and having a target power source 108 connected thereto, a hole injection stop layer 3 of cerium dioxide ($CeO_2$) and germanium dioxide ($GeO_2$) formed on the surface of transparent conductive film 2, a photoelectric converting layer 24 of amorphous selenium (Se) formed on the surface of hole injection stop layer 3, and an electron injection stop layer 7 of antimony trisulfide ($Sb_2S_3$) formed on the surface of photoelectric converting layer 24. Hole injection stop layer 3 serves to prevent injection of holes from transparent conductive film 2 to photoelectric converting layer 24. Electron injection stop layer 7 serves to prevent injection of electrons of the electron beam to photoelectric converting layer 24.

Referring to FIGS. 6 and 7, operation of the conventional camera tube will be described.

Transparent conductive film 2 is fixed at a predetermined positive potential Vt by target power source 108. When light A is incident on one pixel in this state, electron/hole pairs are generated in a portion corresponding to the pixel in photoelectric converting layer 24. Out of electrons and holes generated in photoelectric converting layer 24, electrons move to the side of transparent conductive film 2, while holes move to the side of electron injection stop layer 7. As a result, the potential on the side of electron injection stop layer 7 increases.

On the other hand, on the surface of electron injection stop layer 7, an electron beam B is scanned. When the electron beam B comes onto the pixel having the potential at the side of electron injection stop layer 7 increased by incidence of light, a charging current flows in order to cancel the potential increase of the pixel. The charging current is taken out as a signal output.

In the above-described operation, by setting high the voltage of target power source 108, a high electric field is applied to photoelectric converting layer 24 of amorphous selenium. As a result, holes generated by incidence of light A causes an avalanche multiplication phenomenon (avalanche phenomenon), so that the number of holes increases. As a result, the number of holes reaching electron injection stop layer 7 increases, causing quantum efficiency as seen from the outside to exceed 1 into a value of 10 to 1000. It should be noted that quantum efficiency 1 is a state where one electron/hole pair is generated per photon. More specifically, quantum efficiency 10 corresponds to generation of 10 electron/hole pairs per photon. As described above, by applying a high electric field to photoelectric converting layer 24 of amorphous selenium, quantum efficiency has conventional been increased, so that sensitivity in the camera device has been made high.

However, photoelectric converting layer 24 of amorphous selenium shown in FIG. 7 had the following problems.

FIG. 8 is a graph of spectral sensitivity characteristics of the camera tube in which amorphous selenium shown in FIG. 7 is used as a photoelectric converting layer. The abscissa shows the wavelength, and the ordinate shows the quantum efficiency. Referring to FIG. 8, in the camera tube using the photoelectric converting layer of amorphous selenium, the sensitivity (quantum efficiency) decreases rapidly at the wavelength of 450 nm or more. Therefore, the sensitivity was deteriorated at the wavelength on the red side (approximately 600 to 700 nm).

In order to enhance the sensitivity in a visible light region (approximately 400 to 700 nm), a camera device using a photoelectric converting layer of amorphous silicon has been proposed. FIG. 9 is a graph of spectral sensitivity characteristics of the camera device using amorphous silicon as a photoelectric converting layer. The abscissa shows the wavelength, and the ordinate shows the relative sensitivity. FIG. 10 is a graph of spectral sensitivity characteristics in which the relation between the wavelength and the relative sensitivity shown in FIG. 9 is converted into the relation between the wavelength and the quantum efficiency. As shown in FIG. 9, by using the photoelectric converting layer of amorphous silicon, the relative sensitivity in the visible light region is improved. However, as shown in FIG. 10, in the camera device using the photoelectric converting layer of amorphous silicon, only lower quantum efficiency is obtained compared to the quantum efficiency of the photoelectric converting layer of amorphous selenium shown in FIG. 8. More specifically, it is difficult to prevent injection of electrons and holes in the photoelectric converting layer of amorphous silicon because of its material factor, whereby a high electric field cannot be applied to the photoelectric converting layer, causing the effect of an avalanche multiplication phenomenon to decrease. As a result, the camera device having favorable quantum efficiency (multiplication characteristics) could not be obtained.

As one example of the camera tube, a solid state image sensing device has conventionally been known. FIG. 11 is a cross sectional view of a conventional solid state image sensing device using amorphous selenium as a photoelectric converting layer. This is shown in, for example, Proceedings of National Conference of the Institute of Television Engineers of Japan, 1989, p. 41, and IEEE International Solid-State Circuit Conference, 1990, pp. 212 and 213. Referring to FIG. 11, the conventional solid state image sensing device using a photoelectric converting layer of amorphous selenium includes a p-type semiconductor substrate 8, an element isolation oxide film 10 formed in a predetermined region on the main surface of p-type semiconductor substrate 8 for isolating elements, an n-type signal charge storage region 9 enclosed by element isolation oxide film 10 and formed on the main surface of p-type semiconductor substrate 8, an interlayer oxide film 11 formed so as to cover p-type semiconductor substrate 8 and having a contact hole on n-type signal charge storage region 9, an interconnection layer 14 electrically connected to n-type signal charge storage region 9 in the contact hole of interlayer oxide film 11 and formed so as to extend along interlayer oxide film 11, an interlayer oxide film 12 formed on interconnection layer 14 and interlayer oxide film 11 and having a contact hole in a predetermined region on interconnection layer 14, an interconnection layer 15 electrically connected to interconnection layer 14 in the contact hole of interlayer oxide film 12 and formed so as to extend along interlayer oxide film 12, an interlayer oxide film 13 formed on interconnection layer 15 and interlayer oxide film 12 and having a contact hole in a predetermined region on interconnection layer 15, a pixel electrode 16 for one pixel electrically connected to interconnection layer 15 in the contact hole of interlayer oxide film 13 and formed so as to extend along the surface of interlayer oxide film 13, a hole injection stop layer 27 of cerium dioxide formed on pixel electrode 16 and interlayer oxide film 13, a photoelectric converting layer 24 of amorphous selenium formed on hole injection stop layer 27, an electron injection stop layer 23 of arsenic trisulfide formed on photoelectric converting layer 24, and a transparent conductive film 2 formed on electron injection stop layer 23.

In operation of the solid state image sensing device having the above-described structure, light is incident from above with transparent conductive film 2 therebetween. The light is directed to photoelectric converting layer 24 of amorphous selenium. By direction of the light, electron/hole pairs are generated in photoelectric converting layer 24. Out of the generated electrons and holes, the holes move to the side of electron injection stop layer 23, while the electrons move to the side of hole injection stop layer 27. The holes which move to the side of electron injection stop layer 23 are stored in n-type signal charge storage region 9 through pixel electrode 16, interconnection layer 15 and interconnection layer 14. The holes stored in n-type signal charge storage region 9 are read out as a signal.

The solid state image sensing device using amorphous selenium as a photoelectric converting layer also had problems similar to those of the camera tube using amorphous selenium as a photoelectric converting layer, shown in FIGS. 6 and 7. More specifically, in the solid state image sensing device using amorphous selenium as a photoelectric converting layer, the quantum efficiency (sensitivity) rapidly decreases at the wavelength of 450 nm or more. As a result, the sensitivity of the wavelength on the red side (approximately 700 nm) was deteriorated.

As described above, it was conventionally difficult to improve spectral sensitivity characteristics in the visible light region (especially the region on the red side) in the camera device using amorphous selenium as a photoelectric converting layer, because the quantum efficiency rapidly decreased in the visible light region (especially the region on the red side). Although the sensitivity was improved in the image sensing device using amorphous silicon as a photoelectric converting layer, it was difficult to obtain favorable quantum efficiency (multiplication characteristics) over the entire visible light region. As a result, it was difficult to improve spectral sensitivity characteristics in the visible light region.

SUMMARY OF THE INVENTION

One object of the present invention is to provide a camera device in which spectral sensitivity characteristics in a visible light region (especially the region on the red side) are improved.

Another object of the present invention is to provide a camera device in which quantum efficiency (multiplication characteristics) in the visible light region (especially the region on the red side) is improved.

Still another object of the present invention is to provide a simple method of manufacturing camera devices in which spectral sensitivity characteristics in the visible light region (especially the region on the red side) are improved.

In one aspect of the present invention, the camera device is a camera device having a photoelectric converting portion including: a hole injection stop layer for preventing external injection of holes; a first photoelectric converting layer formed on the surface of the hole injection stop layer and having first spectral sensitivity characteristics by including selenium; a second photoelectric converting layer formed on the surface of the first photoelectric converting layer and having second spectral sensitivity characteristics which are different from those of the first photoelectric converting layer by including a material other than selenium; and an electron injection stop layer formed on the surface of the second photoelectric converting layer for preventing external injection of electrons.

The first photoelectric converting layer having the first spectral sensitivity characteristics is formed on the surface of the hole injection stop layer by including at least selenium. The second photoelectric converting layer having the second spectral sensitivity characteristics which are different from those of the first photoelectric converting layer is formed on the surface of the first photoelectric converting layer by including a material other than selenium. The electron injection stop layer is formed on the surface of the second photoelectric converting layer. As thus structured, injection stop characteristics with respect to at least holes are improved by the first photoelectric converting layer including selenium. Therefore, it is possible to apply a high electric field to the first and second photoelectric converting layers, whereby improved multiplication characteristics (quantum efficiency) can be obtained. The sensitivity in the visible light region (especially the region on the red side) is also improved by the second photoelectric converting layer. As a result, the spectral sensitivity characteristics in the visible light region (especially the region on the red side) are improved.

In another aspect of the present invention, the camera device is a camera device having a photoelectric converting portion including: a hole injection stop layer for preventing external injection of holes; a first photoelectric converting layer formed on the surface of the hole injection stop layer and having first spectral sensitivity characteristics by including selenium; a second photoelectric converting layer formed on the surface of the first photoelectric converting layer and having second spectral sensitivity characteristics which are different from those of the first photoelectric converting layer by including a material other than selenium; a third photoelectric converting layer formed on the surface of the second photoelectric converting layer and having third spectral sensitivity characteristics by including selenium; and an electron injection stop layer formed on the surface of the third photoelectric converting layer for preventing external injection of electrons.

The first photoelectric converting layer having the first spectral sensitivity characteristics by including selenium is formed on the surface of the hole injection stop layer. The second photoelectric converting layer having the second spectral sensitivity characteristics which are different from those of the first photoelectric converting layer by including a material other than selenium is formed on the surface of the first photoelectric converting layer. The third photoelectric converting layer having the third spectral sensitivity characteristics by including selenium is formed on the second photoelectric converting layer. The electron injection stop layer for preventing external injection of electrons is formed on the surface of the third photoelectric converting layer. Because of this structure, injection stop characteristics with respect to holes and electrons are improved by the first photoelectric converting layer and the third photoelectric converting layer. Therefore, it is possible to apply a high electric field to the first, second and third photoelectric converting layers. As a result, improved quantum efficiency (multiplication characteristics) can be obtained. By the second photoelectric converting layer interposed between the first photoelectric converting layer and the third photoelectric converting layer, the sensitivity in the visible light region (especially the region on the red side) is improved, whereby improved spectral sensitivity characteristics can be obtained.

In still another aspect of the present invention, the method of manufacturing the camera device includes the steps of: forming the first photoelectric converting layer having first spectral sensitivity characteristics by including selenium on the hole injection stop layer for preventing external injection of holes; and forming the second photoelectric converting layer having the second spectral sensitivity characteristics which are different from those of the first photoelectric converting layer by including a material other than selenium under the temperature condition of 100° C. or less on the first photoelectric converting layer.

On the first photoelectric converting layer formed on the hole injection stop layer and having the first spectral sensitivity characteristics by including selenium formed is the second photoelectric converting layer having the second spectral sensitivity characteristics which are different from those of the first photoelectric converting layer by including a material other than selenium under the temperature condition of 100° C. or less. Therefore, the second photoelectric converting layer is easily formed on the first photoelectric converting layer including selenium having low heat-resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Figure 1:
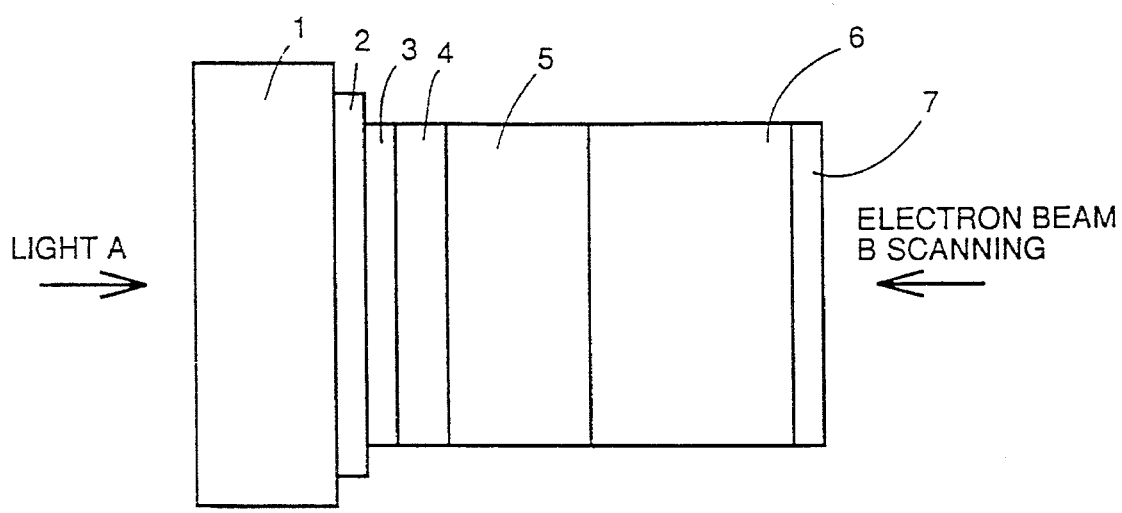
FIG. 1 is a cross sectional view showing a target portion of a camera tube according to one embodiment of the present invention.

Referring to FIG. 1, the camera tube of the first embodiment includes a glass substrate 1, a transparent conductive film 2 formed on the surface of glass substrate 1 and having a target power source (not shown) applied thereto, a hole injection stop layer 3 of $CeO_2$ and $GeO_2$ formed on the surface of transparent conductive film 2, a first photoelectric converting layer (amorphous selenium layer) 4 of amorphous selenium formed on the surface of hole injection stop layer 3, a second photoelectric converting layer (amorphous silicon layer) 5 of amorphous silicon formed on the surface of first photoelectric converting layer 4, a third photoelectric converting layer (amorphous selenium layer) 6 of amorphous selenium formed on the surface of second photoelectric converting layer 5, and an electron injection stop layer 7 of $Sb_2S_3$ formed on the surface of third photoelectric converting layer 6.

As described above, in this embodiment, the photoelectric converting layer is constituted of first photoelectric converting layer 4 of amorphous selenium, second photoelectric converting layer 5 of amorphous silicon, and third photoelectric converting layer 6 of amorphous selenium. By thus constituting the photoelectric converting layer, it is possible to improve spectral sensitivity characteristics in a visible light region (especially the region on the red side).

More specifically, by first photoelectric converting layer 4 and third photoelectric converting layer 6 of amorphous selenium, hole injection stop characteristics of hole injection stop layer 3 and electron injection stop characteristics of electron injection stop layer 7 are respectively improved. Therefore, it is possible to apply a high electric field to first, second and third photoelectric converting layers 4, 5 and 6.

As a result, multiplication characteristics are improved, whereby improved quantum efficiency can be obtained. By second photoelectric converting layer 5 of amorphous silicon, it is also possible to improve the sensitivity in the visible light region. In other words, by combination of first photoelectric converting layer 4, second photoelectric converting layer 5, and third photoelectric converting layer 6, it is possible to improve the multiplication characteristics as well as to obtain favorable sensitivity simultaneously in the visible light region (especially the region on the red side). As a result, it is possible to enhance spectral sensitivity characteristics of the camera device.

Figure 2:
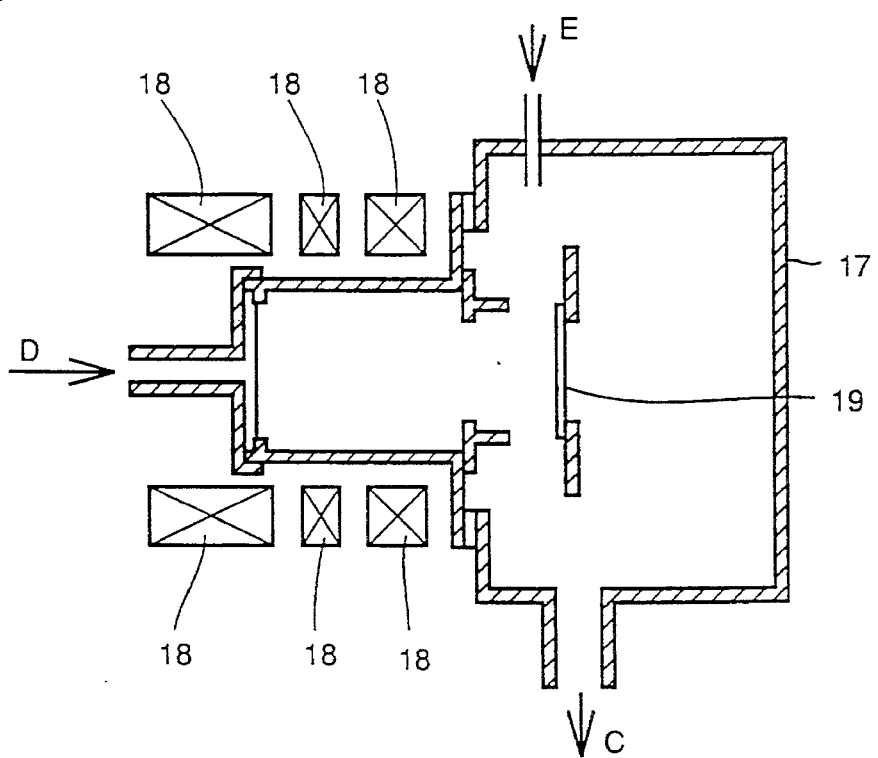
FIG. 2 is a cross sectional view showing an ECR plasma CVD device.

Referring to FIGS. 1 and 2, description will now be given to a method of manufacturing the camera tube of the first embodiment.

First, transparent conductive film 2 is formed on glass substrate 1. Hole injection stop layer 3 of cerium dioxide ($CeO_2$) and germanium dioxide ($GeO_2$) is formed on transparent conductive film 2. First photoelectric converting layer 4 of amorphous selenium is formed on hole injection stop layer 3. Second photoelectric converting layer 5 of amorphous silicon is formed on first photoelectric converting layer 4. Third photoelectric converting layer 6 of amorphous selenium is formed on second photoelectric converting layer 5. Electron injection stop layer 7 of antimony trisulfide ($Sb_2S_3$) is formed on third photoelectric converting layer 6.

Since amorphous selenium has a heat-resistance temperature of 100° C. or less, it is necessary to carry out the step of forming second photoelectric converting layer 5 of amorphous silicon on first photoelectric converting layer (amorphous selenium layer) 4 at a temperature of 100° C. or less. Therefore, a generally used plasma chemical vapor deposition method (CVD method) by glow discharge cannot be used, since it is necessary to heat the substrate to the temperature of 250° C. to 300° C. This is why the present embodiment adopts a plasma CVD method by electron cyclotron resonance (ECR). The ECR plasma CVD method and a device therefore are disclosed in, for example, Electro Chemistry and Industrial Physical Chemistry, Vol. 56, 1988, p. 516, Mat. Res. Soc. Symp. Proc., Vol. 77, pp. 217–222, 1987, Materials Research Society.

Referring to FIG. 2, an ECR plasma CVD device used in the present embodiment includes a vessel 17 and a coil 18 for generating magnetic field. An arrow C is coupled to a vacuum device, not shown. The pressure in vessel 17 is kept at $10^{-4}$ to $10^{-2}$ Torr.

In operation, a microwave is introduced into vessel 17 along an arrow D. When an electron cyclotron condition (for example, magnetic field of 875 gauss with respect to a microwave of 2.45 GHz) is satisfied between the magnetic field by coil 18 and the microwave, energy of the microwave is resonated and absorbed by electrons. In this state, a synthesis gas such as silane is introduced into vessel 17 along an arrow E. As a result, the synthesis gas and electrons of high energy collide with each other, causing plasma to be generated. The generated plasma is introduced into a substrate 19 by a divergence magnetic field or the like. As a result, a reaction occurs on the surface of substrate 19, and amorphous silicon is deposited on substrate 19, whereby second photoelectric converting layer 5 is formed.

As described above, this embodiment adopts the ECR plasma CVD method as a method for depositing amorphous silicon layer (second photoelectric converting layer) 5 of favorable characteristics at 100° C. or less. Although the ECR plasma CVD method is used in this embodiment, the present invention is not limited thereto, but another method in which an amorphous silicon layer can be deposited at 100° C. or less may be used.

Figure 3:
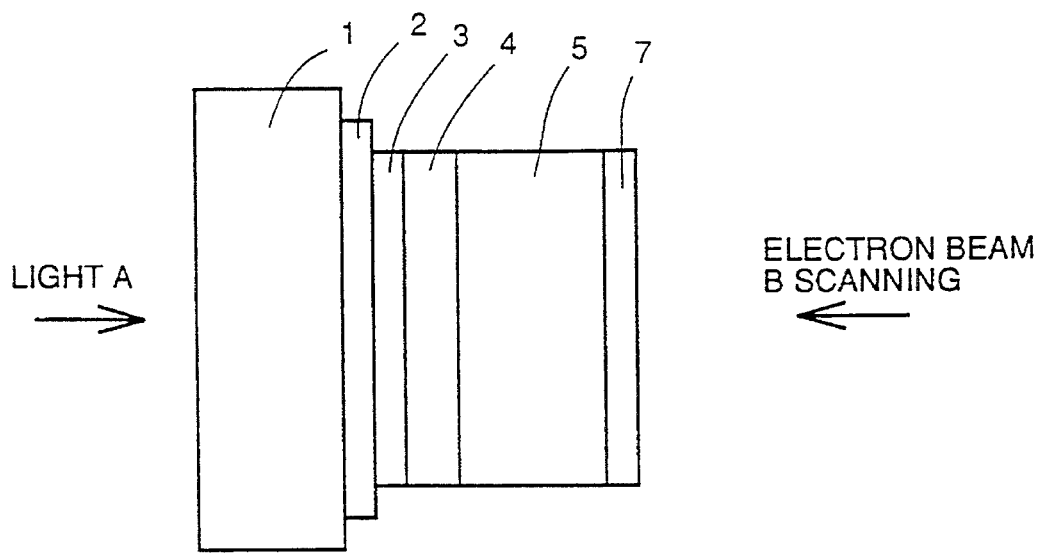
FIG. 3 is a cross sectional view showing a target portion of a camera tube according to a second embodiment of the present invention.

Referring to FIG. 3, in the camera tube of the second embodiment, the photoelectric converting layer is constituted of first photoelectric converting layer 4 of amorphous selenium and second photoelectric converting layer 5 of amorphous silicon, not similar to the camera tube of the first embodiment. By thus constituted, the sensitivity in the visible light region (especially the region on the red side) is improved by second photoelectric converting layer 5 of amorphous silicon. As a result, it is possible to provide a camera tube of superior spectral sensitivity characteristics.

Figure 4:
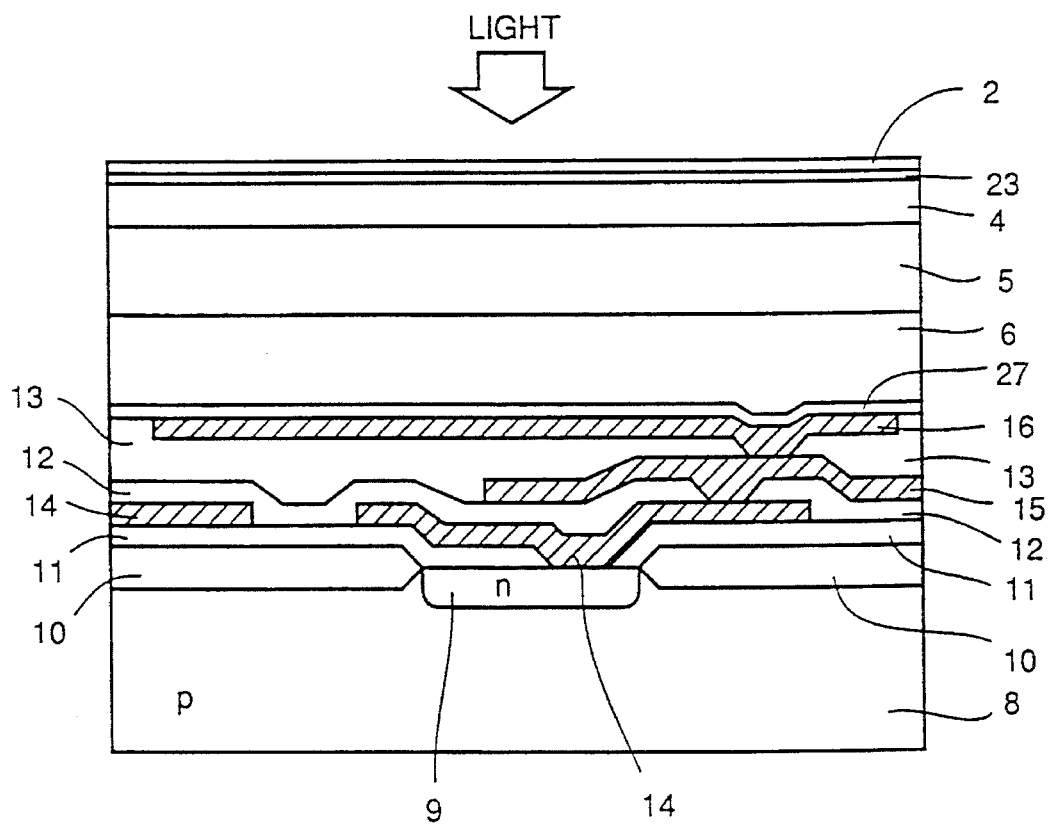
FIG. 4 is a cross sectional view showing one pixel of a solid state image sensing device according to a third embodiment of the present invention.

Referring to FIG. 4, the solid state image sensing device of the third embodiment includes a p-type semiconductor substrate 8, an element isolation oxide film 10 formed in a predetermined region on the main surface of p-type semiconductor substrate 8 for isolating elements, an n-type signal charge storage region 9 formed on the main surface of p-type semiconductor substrate 8 surrounded by element isolation oxide film 10, an interlayer oxide film 11 formed on element isolation oxide film 10 and n-type signal charge storage region 9 and having a contact hole on a predetermined region of n-type signal charge storage region 9, an interconnection layer 14 electrically connected to n-type signal charge storage region 9 in the contact hole of interlayer oxide film 11 and formed so as to extend along interlayer oxide film 11, an interlayer oxide film 12 formed on interconnection layer 14 and interlayer oxide film 11 and having a contact hole on a predetermined region of interconnection layer 14, an interconnection layer 15 electrically connected to interconnection layer 14 in the contact hole of interlayer oxide film 12 and formed so as to extend along interlayer oxide film 12, an interlayer oxide film 13 formed on interconnection layer 15 and interlayer oxide film 12 and having an opening portion on a predetermined region of interconnection layer 15, a pixel electrode 16 for one pixel electrically connected to interconnection layer 15 in the contact hole of interlayer oxide film 13 and formed so as to extend along the surface of interlayer oxide film 13, hole injection stop layer 27 of cerium dioxide formed on pixel electrode 16 and interlayer oxide film 13, third photoelectric converting layer 6 of amorphous selenium formed on hole injection stop layer 27, second photoelectric converting layer 5 of amorphous silicon formed on third photoelectric converting layer 6, first photoelectric converting layer 4 of amorphous selenium formed on second photoelectric converting layer 5, electron injection stop layer 23 of arsenic trisulfide formed on first photoelectric converting layer 4, and transparent conductive film 2 formed on hole injection stop layer 23.

As described above, in the solid state image sensing device of the third embodiment, the photoelectric converting layer is constituted of three layers of first photoelectric converting layer 4 of amorphous selenium, second photoelectric converting layer 5 of amorphous silicon having different spectral sensitivity characteristics from those of first photoelectric converting layer of amorphous selenium, and third photoelectric converting layer 6 of amorphous selenium. By thus constituted, it is possible to obtain the same effects as those of the camera tube of the first embodiment shown in FIG. 1. More specifically, by first photoelectric converting layer 4 and third photoelectric converting layer 6 of amorphous selenium, injection stop characteristics of hole injection stop layer 27 and electron injection stop layer 23 are respectively improved. As a result, it is possible to apply a high electric field to the photoelectric converting layer of first, second and third photoelectric converting layers 4, 5 and 6. As a result, it is possible to improve multiplication characteristics (quantum efficiency) of the camera device. It is also possible to improve the sensitivity in the visible light region (especially the region on the red side) by second photoelectric converting layer 5 of spectral sensitivity characteristics which are different from those of first and third photoelectric converting layers 4 and 6. Therefore, also in the solid state image sensing device of the third embodiment, it is possible to improve the multiplication characteristics (quantum efficiency) and the sensitivity in the visible light region (especially the region of the red side) simultaneously, whereby spectral sensitivity characteristics of the solid state image sensing device can be improved.

Figure 5:
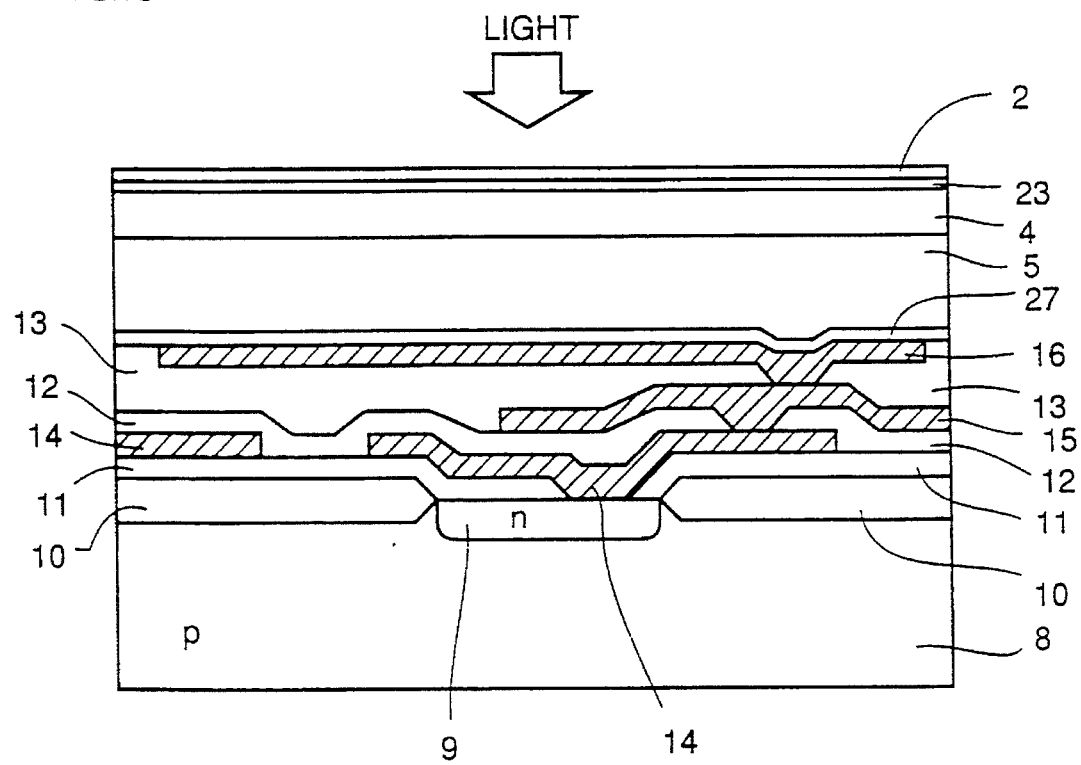
FIG. 5 is a cross sectional view showing one pixel of a solid state image sensing device according to a fourth embodiment of the present invention.
Figure 6:
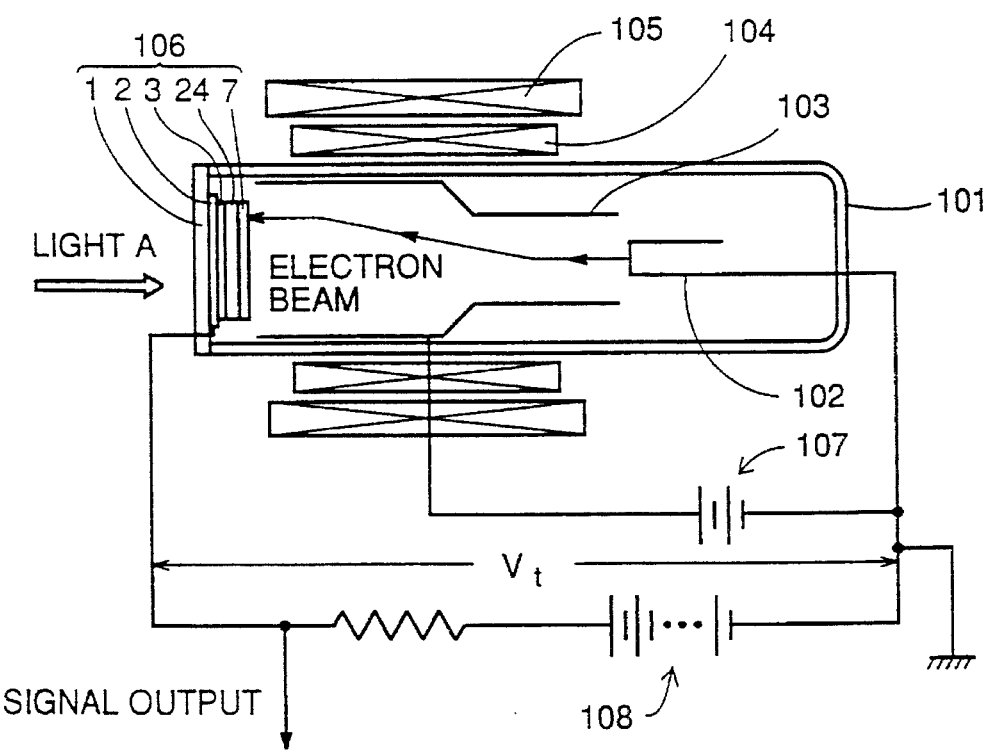
FIG. 6 is a schematic cross sectional view showing a structure of a conventional camera tube.
Figure 7:
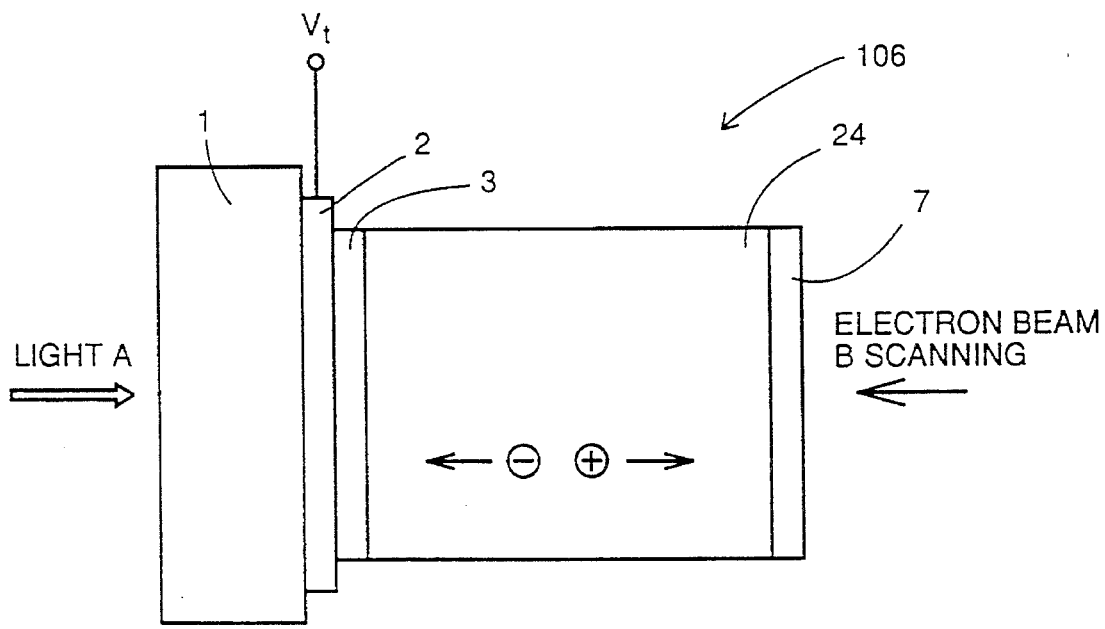
FIG. 7 is an enlarged cross sectional view of a target portion of the conventional camera tube shown in FIG. 6.
Figure 8:
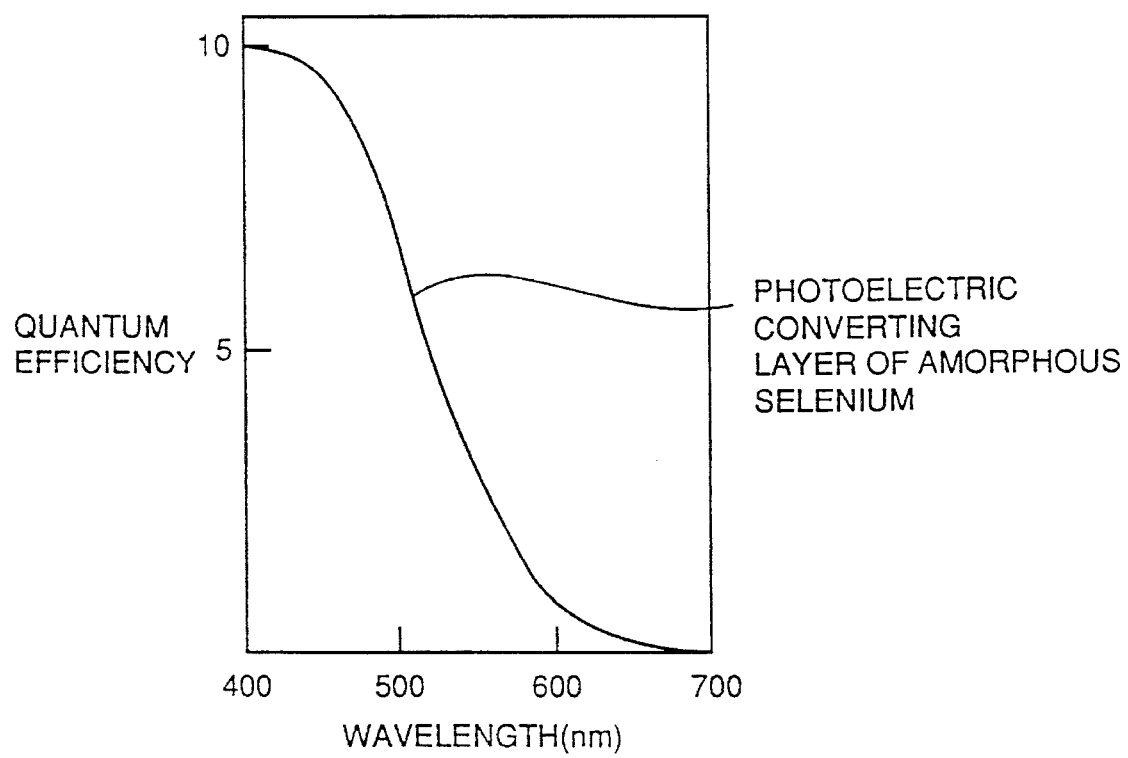
FIG. 8 is a graph of spectral sensitivity characteristics of the camera tube using a photoelectric converting layer of amorphous selenium.
Figure 9:
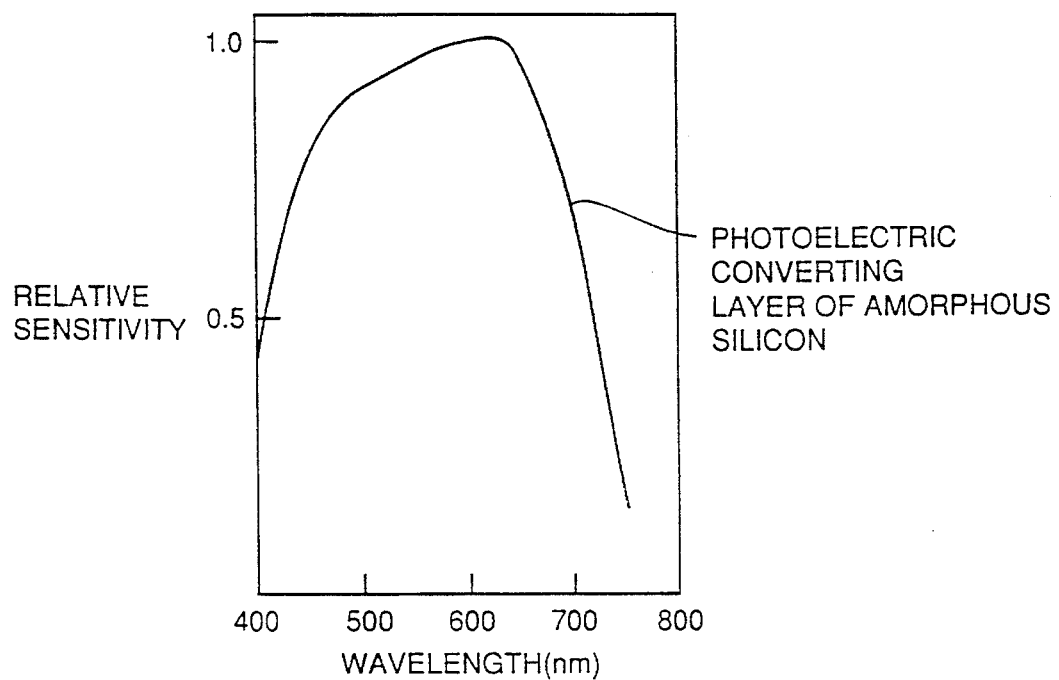
FIG. 9 is a graph of spectral sensitivity characteristics of the conventional photoelectric converting layer of amorphous silicon.
Figure 10:
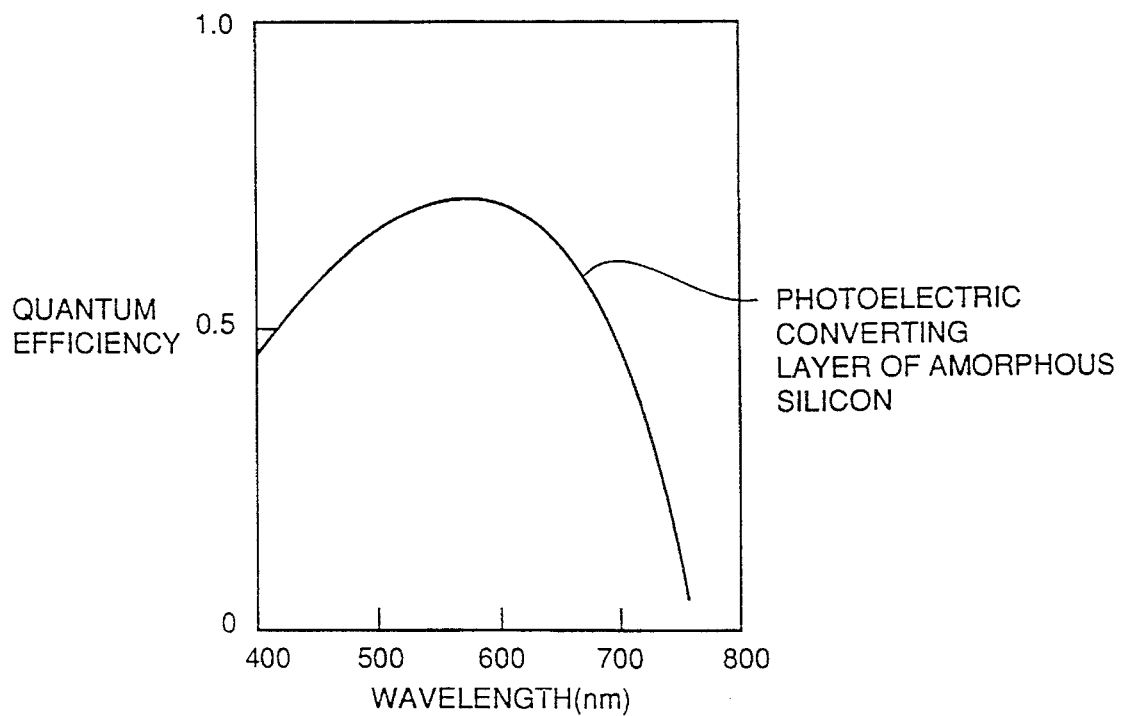
FIG. 10 is a graph of spectral sensitivity characteristics in which the graph of spectral sensitivity characteristics shown in FIG. 9 is converted into the relation between the wavelength and the quantum efficiency.
Figure 11:
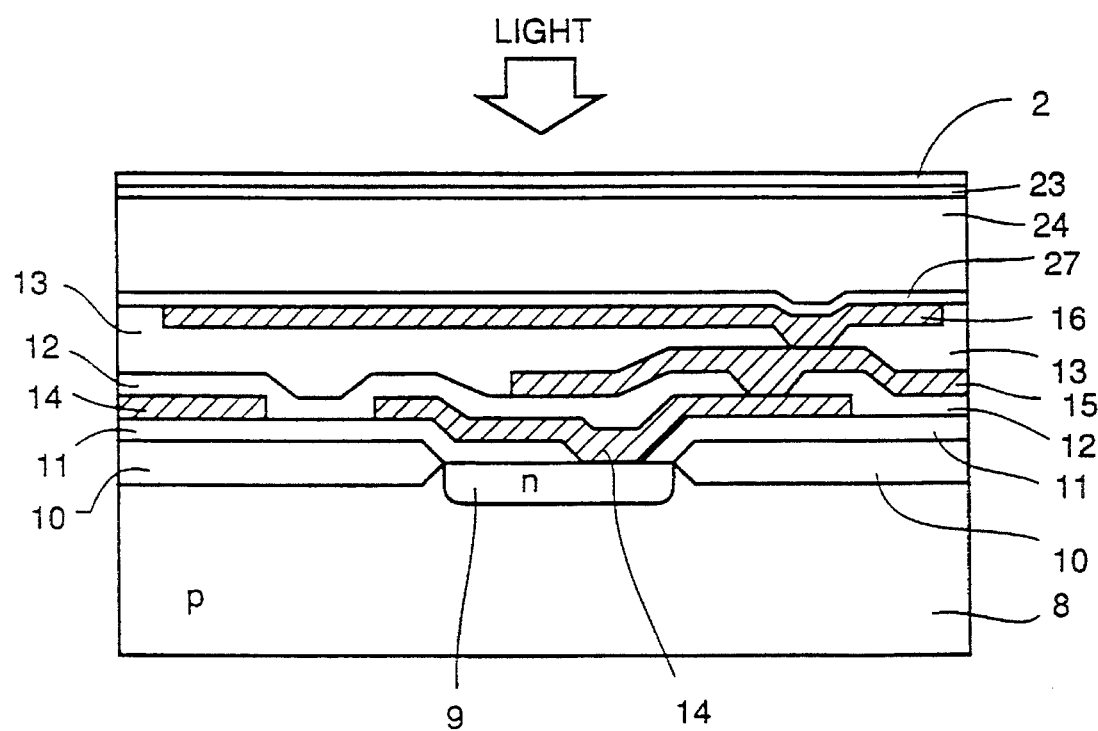
FIG. 11 is a cross sectional view of the conventional solid state image sensing device using a photoelectric converting layer of amorphous selenium.

Referring to FIG. 5, in the fourth embodiment, not similar to the third embodiment shown in FIG. 4, the photoelectric converting layer is constituted of two layers of first photoelectric converting layer 4 of amorphous selenium and second photoelectric converting layer 5 of amorphous silicon. By thus constituted, it is possible to improve the sensitivity in the visible light region (especially the region on the red side) by second photoelectric converting layer 5 of amorphous silicon having different spectral sensitivity characteristics from those of first photoelectric converting layer 4 of amorphous selenium. As described above, also in the solid state image sensing device of the fourth embodiment, it is possible to improve the sensitivity in the visible light region (especially the region on the red side), resulting in improvement of spectral sensitivity characteristics of the solid state image sensing device.

Although second photoelectric converting layer 5 of amorphous silicon is used as a layer having different spectral sensitivity characteristics in the first to the fourth embodiments, the present invention is not limited thereto, but second photoelectric converting layer 5 may be formed of other materials having high sensitivity in the visible light region (especially the region on the red side). Moreover, in order to make high the sensitivity of infrared light (the wavelength of 800 to 900 nm or more), it is effective to use amorphous silicon germanium or amorphous silicon tin as second photoelectric converting layer 5.

In the first to the fourth embodiments, in order to enhance heat-resistance of first photoelectric converting layer 4 of amorphous selenium, a film, such as a silicon nitride film, for preventing crystallization may be inserted between the first photoelectric converting layer of amorphous selenium and the second photoelectric converting layer of amorphous silicon.

In the first to the fourth embodiments, in order to enhance heat-resistance of amorphous selenium, a material, such as arsenic, for improving heat-resistance may be mixed in amorphous selenium. Mixture of arsenic in amorphous selenium also has the effect of improving spectral sensitivity characteristics on the red side.

In one camera device according to the present invention, the first photoelectric converting layer having first spectral sensitivity characteristics by including selenium is formed on the surface of the hole injection stop layer. The second photoelectric converting layer having second spectral sensitivity characteristics which are different from those of the first photoelectric converting layer by including a material other than selenium is formed on the surface of the first photoelectric converting layer. The electron injection stop layer is formed on the surface of the second photoelectric converting layer. By thus structured, the hole injection stop characteristics of the hole injection stop layer are improved by the first photoelectric converting layer, whereby it is possible to apply a high electric field to the photoelectric converting layer of the first photoelectric converting layer and the second photoelectric converting layer. As a result, it is possible to enhance the multiplication characteristics (quantum efficiency). Since the sensitivity the visible light region (especially the region on the red side) is improved by the second photoelectric converting layer simultaneously, superior spectral sensitivity characteristics can be obtained.

In another camera device of the present invention, the first photoelectric converting layer having first spectral sensitivity characteristics by including selenium is formed on the surface of the hole injection stop layer. The second photoelectric converting layer having second spectral sensitivity characteristics which are different from those of the first photoelectric converting layer by including a material other than selenium is formed on the surface of the first photoelectric converting layer. The third photoelectric converting layer having third spectral sensitivity characteristics by including selenium is formed on the surface of the second photoelectric converting layer. The electron injection stop layer is formed on the surface of the third photoelectric converting layer. By thus structured, since injection stop characteristics of the hole injection stop layer and the electron injection stop layer are respectively improved by the first and third photoelectric converting layers, it is possible to apply a high electric field to the photoelectric converting layer of the first, second and third photoelectric converting layers, whereby multiplication characteristics can be improved. Simultaneously, the sensitivity in the visible light region (especially the region on the red side) is improved by the second photoelectric converting layer having spectral sensitivity characteristics which are different from those of the first photoelectric converting layer. As a result, it is possible to provide a camera device having superior spectral sensitivity characteristics.

In the method of manufacturing the camera device of the present invention, on the first photoelectric converting layer having first spectral sensitivity characteristics by including selenium formed on the hole injection stop layer, formed under the temperature condition of 100° C. or less is the second photoelectric converting layer having second spectral sensitivity characteristics which are different from those of the first photoelectric converting layer by including a material other than selenium. As a result, it is possible to form easily the second photoelectric converting layer on the first photoelectric converting layer including selenium.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a camera device, comprising the steps of:

forming a first photoelectric converting layer having first spectral sensitivity characteristics by including selenium on a hole injection stop layer for preventing external injection of holes; and forming a second photoelectric converting layer having second spectral sensitivity characteristics which are different from those of said first photoelectric converting layer by including a material other than said selenium on said first photoelectric converting layer at a temperature condition of at most 100° C.

2. The method of manufacturing a camera device as recited in claim 1, wherein said step of forming the second photoelectric converting layer includes the step of forming the same by an ECR plasma CVD method.

* * * * *